US009515616B2

United States Patent
Bäcklund

(10) Patent No.: US 9,515,616 B2
(45) Date of Patent: Dec. 6, 2016

(54) TUNABLE TUBE AMPLIFIER SYSTEM OF A RADIO-FREQUENCY POWER GENERATOR

(71) Applicant: GENERAL ELECTRIC COMPANY, Schenectady, NY (US)

(72) Inventor: Andreas Bäcklund, Uppsala (SE)

(73) Assignee: General Electric Company, Schenectady, NY (US)

( * ) Notice: Subject to any disclaimer, the term of this patent is extended or adjusted under 35 U.S.C. 154(b) by 42 days.

(21) Appl. No.: 14/575,993

(22) Filed: Dec. 18, 2014

(65) Prior Publication Data
US 2016/0181994 A1    Jun. 23, 2016

(51) Int. Cl.
| | | |
|---|---|---|
| H03F 1/00 | (2006.01) |
| H03F 1/56 | (2006.01) |
| H01G 5/01 | (2006.01) |
| H01G 5/40 | (2006.01) |
| H03F 3/189 | (2006.01) |
| H03F 3/22 | (2006.01) |

(Continued)

(52) U.S. Cl.
CPC ............... *H03F 1/56* (2013.01); *H01G 5/01* (2013.01); *H01G 5/40* (2013.01); *H01J 25/00* (2013.01); *H03F 1/04* (2013.01); *H03F 3/189* (2013.01); *H03F 3/22* (2013.01); *H05G 1/00* (2013.01); *H05G 1/02* (2013.01); *H05H 7/02* (2013.01); *H03F 2200/267* (2013.01); *H03F 2200/451* (2013.01); *H05H 2007/025* (2013.01)

(58) Field of Classification Search
CPC ............... H03F 1/00; H03F 3/58; H03F 3/54
USPC ............................................. 330/65, 43, 44
See application file for complete search history.

(56) References Cited

U.S. PATENT DOCUMENTS

| 2,293,152 A | 8/1942 | Litton | |
|---|---|---|---|
| 2,551,715 A * | 5/1951 | Young | H01J 19/80 330/115 |

(Continued)

FOREIGN PATENT DOCUMENTS

| GB | 696801 A | 9/1953 |
|---|---|---|
| GB | 760323 A | 10/1956 |

OTHER PUBLICATIONS

Whitaker, Jerry C., Power Vacuum Tubes Handbook 2nd Edition, Chapter 5, "Applying Vacuum Tube Devices" (2000).

(Continued)

*Primary Examiner* — Henry Choe
(74) *Attorney, Agent, or Firm* — Dean D. Small; The Small Patent Law Group, LLC

(57) ABSTRACT

Tube amplifier system including a plurality of conductor walls extending parallel to a longitudinal axis and defining an interior space therebetween. The tube amplifier system also including a shorting deck that extends transverse to the longitudinal axis. The shorting deck is electrically coupled to the conductor walls. The tube amplifier system also includes a movable tray assembly having a grounding deck that extends parallel to the shorting deck. The grounding deck and the shorting deck define an output cavity therebetween that has a length. The movable tray assembly is removably mounted to at least one of the conductor walls such that the grounding deck is capable of being positioned at multiple different levels along the longitudinal axis to change the length of the output cavity.

20 Claims, 11 Drawing Sheets

(51) Int. Cl.
*H01J 25/00* (2006.01)
*H03F 1/04* (2006.01)
*H05G 1/00* (2006.01)
*H05G 1/02* (2006.01)
*H05H 7/02* (2006.01)

(56) References Cited

U.S. PATENT DOCUMENTS

| | | | |
|---|---|---|---|
| 2,837,686 A | | 6/1958 | Drieschman et al. |
| 3,133,253 A | * | 5/1964 | Lader ............... H03B 19/10 315/39 |
| 3,784,911 A | | 1/1974 | Ramstrom |
| 3,904,995 A | * | 9/1975 | Phillips ............... H01P 1/28 330/286 |
| 6,133,786 A | * | 10/2000 | Symons ............. H01J 25/04 313/293 |
| 6,417,634 B1 | | 7/2002 | Bergstrom |
| 6,724,261 B2 | * | 4/2004 | Cheo ................. H03F 3/602 330/295 |
| 7,339,366 B2 | | 3/2008 | Li |
| 7,982,561 B2 | * | 7/2011 | Mendenhall ........ H01P 1/202 333/219 |
| 8,106,370 B2 | | 1/2012 | Norling et al. |
| 8,106,570 B2 | | 1/2012 | Norling et al. |
| 8,153,997 B2 | | 4/2012 | Norling et al. |
| 8,169,277 B2 | | 5/2012 | McIntyre et al. |
| 8,653,762 B2 | | 2/2014 | Eriksson et al. |

OTHER PUBLICATIONS

Tube Amplification Unit (TAU) of General Electric MINITrace, Part No. 907630 (1999).
Kurkin, G.Y., "Other RF Power Sources," In Frontiers of Accelerator Technology (1999).
MINITrace Qilin: Installation Manual. Revision 13 (2014). pp. 1-16 and 217-223.
MINITrace Qilin: Service Manual, Revision 14 (2014), pp. 361-363 and 423-429.
International Search Report and Written Opinion from corresponding PCT application PCT/US2015/053124 dated Jan. 4, 2016; 12 pages.

\* cited by examiner

TUNABLE TUBE AMPLIFIER SYSTEM OF A RADIO-FREQUENCY POWER GENERATOR

CROSS-REFERENCE TO RELATED APPLICATIONS

The subject matter set forth herein is similar to subject matter described in U.S. application Ser. Nos. 14/575,885; 14/575,914; and 14/575,958, which are filed on the same day as the present application. Each of the above applications is incorporated herein by reference in its entirety.

BACKGROUND

The subject matter herein relates generally to radio-frequency (RF) power generators and, more particularly, to mechanisms and methods for tuning a tube amplifier system in an RF power generator.

Radioisotopes (also called radionuclides) have several applications in medical therapy, imaging, and research, as well as other applications that are not medically related. Systems that produce radioisotopes typically include a particle accelerator, such as a cyclotron, that accelerates a beam of charged particles (e.g., H$^-$ ions) and directs the beam into a target material to generate the isotopes. The cyclotron includes a particle source that provides the particles to a central region of an acceleration chamber. The cyclotron uses electrical and magnetic fields to accelerate and guide the particles along a predetermined orbit within the acceleration chamber. The magnetic fields are provided by electromagnets and a magnet yoke that surrounds the acceleration chamber. The electrical fields are generated by a pair of radio frequency (RF) electrodes (or dees) that are located within the acceleration chamber. The RF electrodes are electrically coupled to an RF power generator that may include, for example, oscillators, amplifiers, control circuitry, and power supplies. The RF power generator energizes the RF electrodes to provide the electrical field. The electrical and magnetic fields within the acceleration chamber cause the particles to take a spiral-like orbit that has an increasing radius. When the particles reach an outer portion of the orbit, the particles are directed toward the target material for radioisotope production. In addition to controlling the orbit of the particles, the RF electrodes may be used to pull the particles from a particle source in the acceleration chamber.

To operate the RF electrodes within the acceleration chamber, a considerable amount of electric power (e.g., 5 kW to 2 MW) is generated by the RF power generator and delivered to the RF electrodes. The RF power generator includes, among other things, an enclosure that has a tube amplifier system including a power electron vacuum tube. The power electron vacuum tube is hereinafter referred to as a power tube. The power tube may be, for example, a power triode having a cathode, anode, and control grid. The power tube may also be a tetrode or pentode. The tube amplifier system may also include one or more resonators that each have an inner conductor and an outer conductor.

The tube amplifier system may operate at high frequencies, such as within the very high frequency (VHF) range or higher. When operating at such frequencies, each substantial component within the tube amplifier system may have an effect on the ultimate performance of the tube amplifier system. Due to the number of interconnected components and the manufacturing tolerances for each component, it is often necessary to tune the tube amplifier system to achieve a designated performance. For example, it may be necessary to adjust a length of a resonator within the tube amplifier system by moving a shorting deck. For systems that use a pickup loop, moving the shorting deck may render it necessary to re-position the pickup loop. As another example of system tuning, it may be necessary to adjust a capacitor of one of the resonators to provide more or less capacitance.

Adjustments such as those described above can be expensive and/or time-consuming. Moreover, due to the number of components and manufacturing tolerances, the overall tuning process (e.g., number, order, and extent of adjustments) for one system is often different than the tuning processes for other systems. Tube amplifier systems that allow for a more robust or repeatable tuning process are desired.

BRIEF DESCRIPTION

In an embodiment, a tube amplifier system is provided that includes a plurality of conductor walls extending parallel to a longitudinal axis and defining an interior space therebetween. The tube amplifier system also including a shorting deck that extends transverse to the longitudinal axis. The shorting deck is electrically coupled to the conductor walls. The tube amplifier system also includes a movable tray assembly having a grounding deck that extends parallel to the shorting deck. The grounding deck and the shorting deck define an output cavity therebetween that has a length measured along the longitudinal axis. The movable tray assembly is removably mounted to at least one of the conductor walls such that the grounding deck is capable of being positioned at multiple different levels along the longitudinal axis to change the length of the output cavity.

In an embodiment, a movable tray assembly configured to be a part of a tube amplifier system. The movable tray assembly includes a grounding deck having an input side and an output side that face in opposite directions. The movable tray assembly also includes a sidewall extending away from the input side of the grounding deck. The movable tray assembly also includes a shorting deck extending parallel to the grounding deck. The sidewall extends between and mechanically and electrically couples the grounding deck and the shorting deck. The grounding deck, the sidewall, and the shorting deck define a input cavity. The grounding deck, the sidewall, and the shorting deck are configured to have fixed positions with respect to one another and move as a unit when the movable tray assembly is moved for positioning with respect to the tube amplifier system.

In an embodiment, a tuning capacitor assembly is provided. The tuning capacitor assembly includes a connector wall that surrounds a central axis and defines a thru-hole that is configured to receive a power tube. The connector wall has an inner side that faces inward toward the central axis and an outer side that faces outward. The tuning capacitor assembly also includes a tuning sheet that surrounds the central axis and interfaces with the connector wall. The tuning sheet has an inner side that faces inward toward the central axis and an outer side that faces outward. The outer sides of the connector wall and the tuning sheet form a combined capacitive surface. The tuning sheet is movable along the central axis to adjust an amount of the combined capacitive surface.

DETAILED DESCRIPTION

Figure 1:
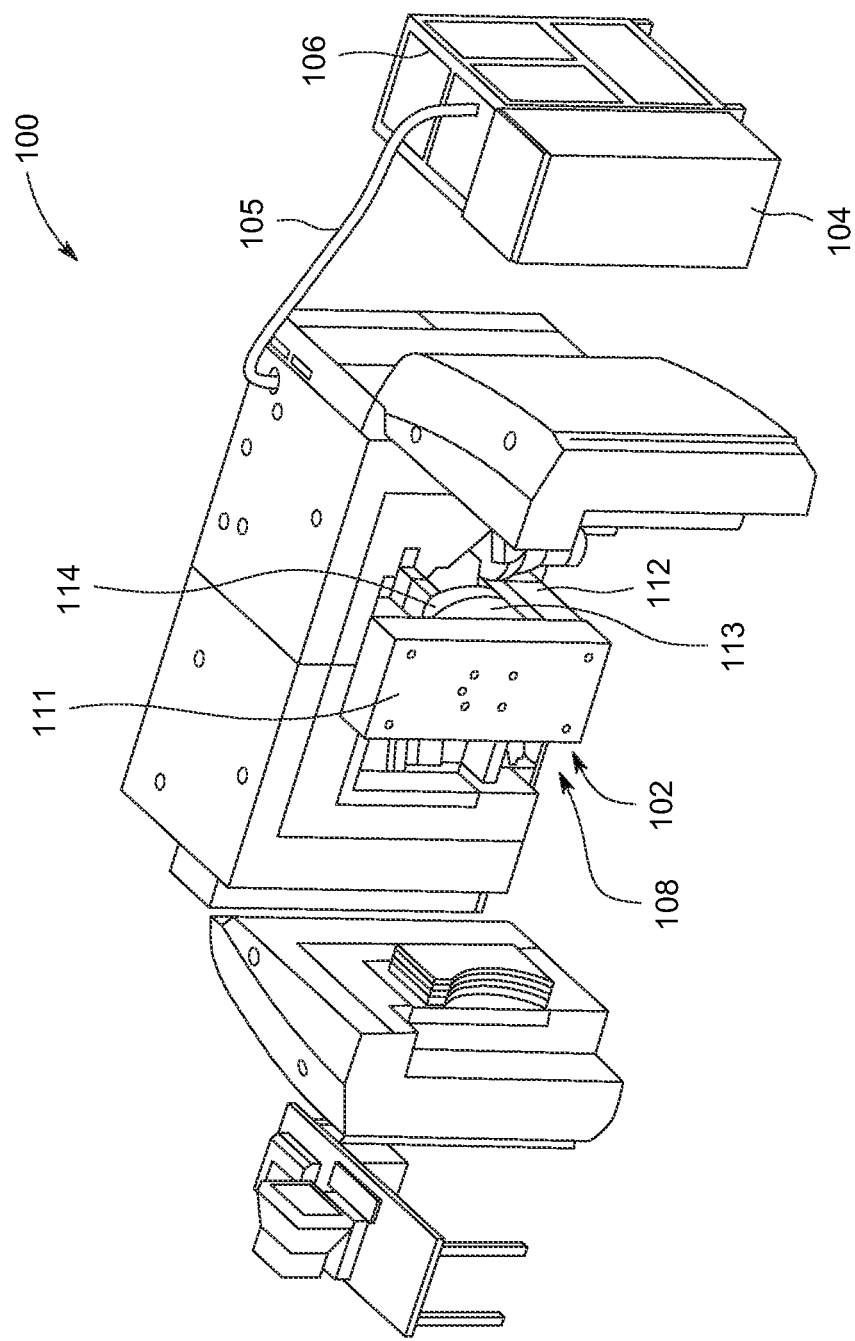
FIG. 1 is a perspective view of an isotope production system in accordance with an embodiment.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated, such as by stating "only a single" element or step. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments set forth herein include radio-frequency (RF) power generators that include a power tube and at least one resonator coupled to the power tube. Embodiments may also include movable tray assemblies, tube amplifier systems (or RF amplifier systems), tuning capacitor assemblies, and methods regarding the same. The resonators may include input and output resonators that may be, for example, coaxial transmission line resonators that each include an inner conductor and an outer conductor. The input and output resonators may be characterized as high-Q resonators that are configured to operate at a designated frequency, such as within the very high frequency (VHF) band or higher. As one example, the designated frequency may be 100 MHz. The input and output resonators may be ¼ wavelength resonators (or λ/4 resonators). Although the RF power generator and the tube amplifier system described herein is used to supply power to a particle accelerator, it should be understood that the RF power generator and the tube amplifier system may be used in other applications. In particular embodiments, the RF power generator or tube amplifier system is a high power system that is capable of generating, for example, 1,000 W or more and 500 V or more.

A technical effect provided by one or more embodiments may include one or more robust and reliable mechanisms for coarse tuning resonators and/or fine tuning the resonators. Another technical effect may include a movable tray assembly that includes a plurality of operative components of a tube amplifier system that are coupled in substantially fixed positions with respect to a grounding deck of the tube amplifier system. The movable tray assembly may allow a technician to assemble, test, and/or tune the operative components prior to the movable tray assembly being positioned within and incorporated into the tube amplifier system. The movable tray assembly may also allow a technician to remove the movable tray assembly from the tube amplifier system and then repair, service, test, and/or tune one or more operative components of the movable tray assembly outside of the tube amplifier system. For example, the movable tray assembly may permit the technician to turn the movable tray assembly upside down relative to the orientation of the movable tray assembly within the tube amplifier system. In the upside-down orientation, the technician may position the movable tray assembly on a support structure (e.g., bench), which may provide easier access to certain operative components, such as the operative components of an input resonator. When the movable tray assembly is positioned within the tube amplifier system, the grounding deck and the plurality of components may move as a unit.

Another technical effect may include a mechanism for fine tuning one of the resonators in a more robust and reliable manner than conventional mechanisms. Another technical effect may include more simplified processes for assembling, repairing, servicing, and/or tuning a tube amplifier system. In particular embodiments, the movable tray assembly may reduce an amount of time that is typically taken by a technician to replace an operative component of the tube amplifier system and tune the tube amplifier system. The reduction in time may be, for example, at least thirty (30) minutes, at least one (1) hour, or at least two (2) hours.

FIG. 1 is a perspective view of an isotope production system 100 in accordance with an embodiment. The isotope production system 100 includes a particle accelerator 102 that is operably coupled to a control cabinet 104 and a RF power generator 106. In the illustrated embodiment, the particle accelerator 102 is an isochronous cyclotron, but other types of particle accelerators may be used. RF energy or power is supplied to the particle accelerator 102 through an RF cable 105. As shown, the particle accelerator 102 includes a magnet assembly 108 that includes yoke sections 111, 112 and electromagnets 113, 114 that are coupled to the yoke sections 111, 112, respectively.

Figure 2:
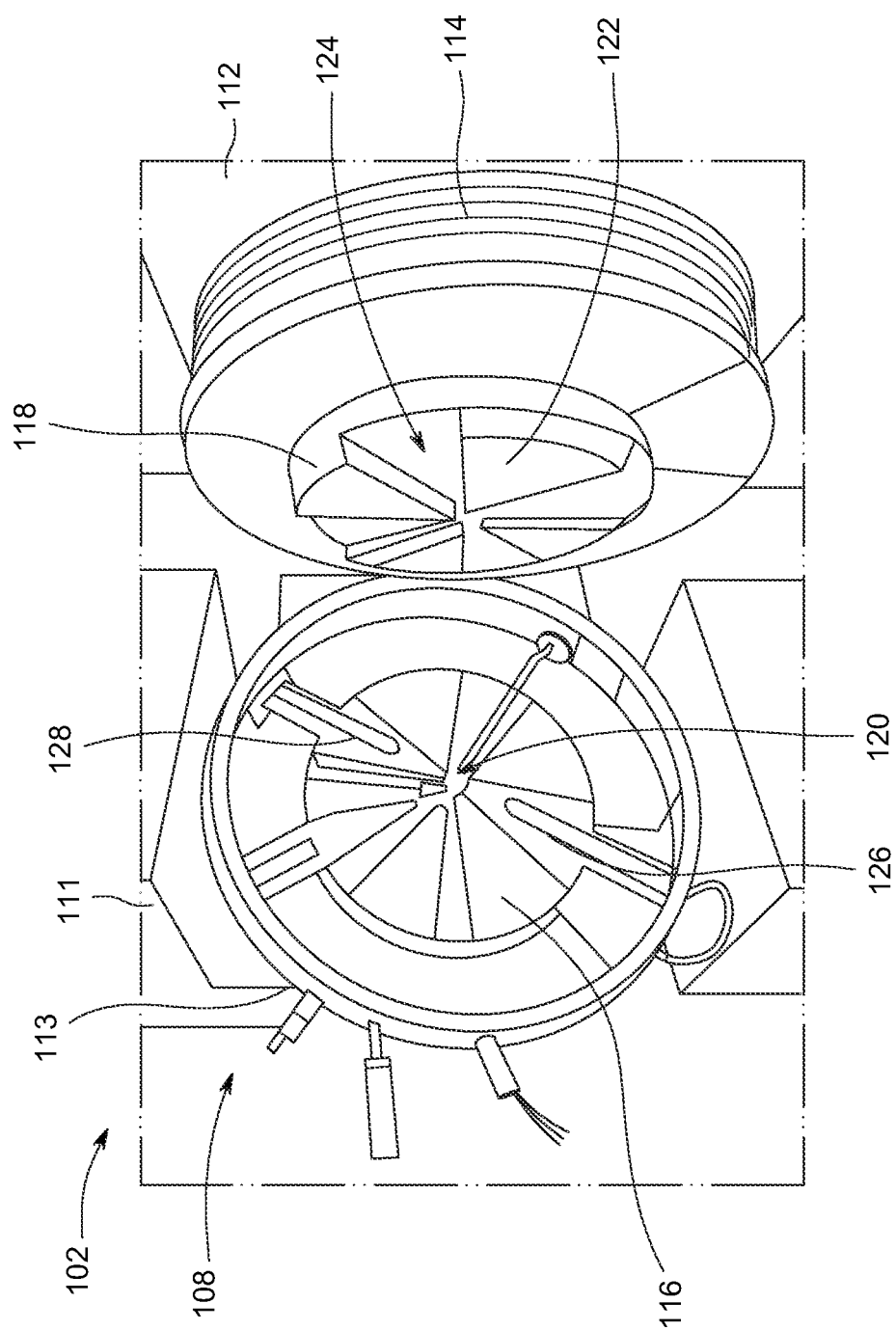
FIG. 2 illustrates a perspective view of the isotope production system of FIG. 1 having a cyclotron that is opened to illustrate components of the cyclotron.

FIG. 2 is a perspective view of a portion of the particle accelerator 102. Although the following description is with respect to the particle accelerator 102 being a cyclotron, it is understood that embodiments may include other particle accelerators and sub-systems of the same. As shown in FIG. 2, the particle accelerator 102 includes the magnet assembly 108 having the yoke sections 111, 112 and the electromagnets 113, 114. The electromagnets 113, 114 are magnet coils in the illustrated embodiment. The particle accelerator 102 may also include pole tops 116, 118. The pole top 116 is secured to the yoke section 111, and the pole top 118 is secured to the yoke section 112. As shown, the yoke section 112 is rotatably coupled to the yoke section 111. During operation, the yoke section 112 is in a closed position (as shown in FIG. 1) such that the pole tops 116, 118 oppose each other and an acceleration chamber is defined therebetween. When the particle accelerator 102 is not operating, the yoke section 112 may be opened to allow access to the acceleration chamber.

The acceleration chamber is configured to allow charged particles, such as $^1H^-$ ions, to be accelerated therein along a predetermined curved path that wraps in a spiral manner about an axis that extends between centers of the opposing pole tops 116, 118. The charged particles are initially positioned proximate to a central region 120 of the acceleration chamber. When the particle accelerator 102 is activated, the path of the charged particles may orbit around the axis that extends between the pole tops 116, 118. In particular embodiments, the pole top 118 includes hills 122 and valleys 124. The particle accelerator 102 also includes a pair of RF electrodes 126, 128 that are positioned adjacent to the pole top 116. The RF electrodes 126, 128 are sized and shaped to be received within corresponding valleys 124 of the pole tope 118 when the yoke section 112 is closed.

The RF electrodes 126, 128 are configured to be energized by the RF power generator 106 (FIG. 1) to generate an electrical field. The magnetic field is provided by the yoke sections 111, 112 and the electromagnets 113, 114. When the electromagnets 113, 114 are activated, a magnetic flux may flow between the pole tops 116, 118 and through the yoke sections 111, 112 around the acceleration chamber. When the electrical field is combined with the magnetic field, the particle accelerator 102 may direct the particles along the predetermined orbit. The RF electrodes 126, 128 cooperate with each other and form a resonant system that includes inductive and capacitive elements tuned to a predetermined frequency (e.g., 100 MHz). Accordingly, the RF electrodes 126, 128 are controlled by the RF power generator 106 to accelerate the charged particles.

In particular embodiments, the system 100 uses $^1H^-$ technology and brings the charged particles (negative hydrogen ions) to a designated energy with a designated beam current. In such embodiments, the negative hydrogen ions are accelerated and guided through the particle accelerator 102. The negative hydrogen ions may then hit a stripping foil (not shown) such that a pair of electrons are removed and a positive ion, $^1H^+$ is formed. The positive ion may be directed into an extraction system (not shown). However, embodiments described herein may be applicable to other types of particle accelerators and cyclotrons. For example, in alternative embodiments, the charged particles may be positive ions, such as $^1H^+$, $^2H^+$, and $^3He^+$. In such alternative embodiments, the extraction system may include an electrostatic deflector that creates an electric field that guides the particle beam toward the target material.

The system 100 is configured to produce radioisotopes (also called radionuclides) that may be used in medical imaging, research, and therapy, but also for other applications that are not medically related, such as scientific research or analysis. When used for medical purposes, such as in Nuclear Medicine (NM) imaging or Positron Emission Tomography (PET) imaging, the radioisotopes may also be called tracers. By way of example, the system 100 may generate protons to make $^{18}F^-$ isotopes in liquid form, $^{11}C$ isotopes as $CO_2$, and $^{13}N$ isotopes as $NH_3$. The target material used to make these isotopes may be enriched $^{18}O$ water, natural $^{14}N_2$ gas, $^{16}O$-water. In some embodiments, the system 100 may also generate protons or deuterons in order to produce $^{15}O$ gases (oxygen, carbon dioxide, and carbon monoxide) and $^{15}O$ labeled water.

The system 100 may also be configured to accelerate the charged particles to a predetermined energy level. For example, some embodiments described herein accelerate the charged particles to an energy of approximately 18 MeV or less. In other embodiments, the system 100 accelerates the charged particles to an energy of approximately 16.5 MeV or less. In particular embodiments, the system 100 accelerates the charged particles to an energy of approximately 9.6 MeV or less. In more particular embodiments, the system 100 accelerates the charged particles to an energy of approximately 7.8 MeV or less. However, embodiments describe herein may also have an energy above 18 MeV. For example, embodiments may have an energy above 100 MeV, 500 MeV or more. Likewise, embodiments may utilize various beam current values. By way of example, the beam current may be between about of approximately 10-30 μA. In other embodiments, the beam current may be above 30 μA, above 50 μA, or above 70 μA. Yet in other embodiments, the beam current may be above 100 μA, above 150 μA, or above 200 μA.

Figure 3:
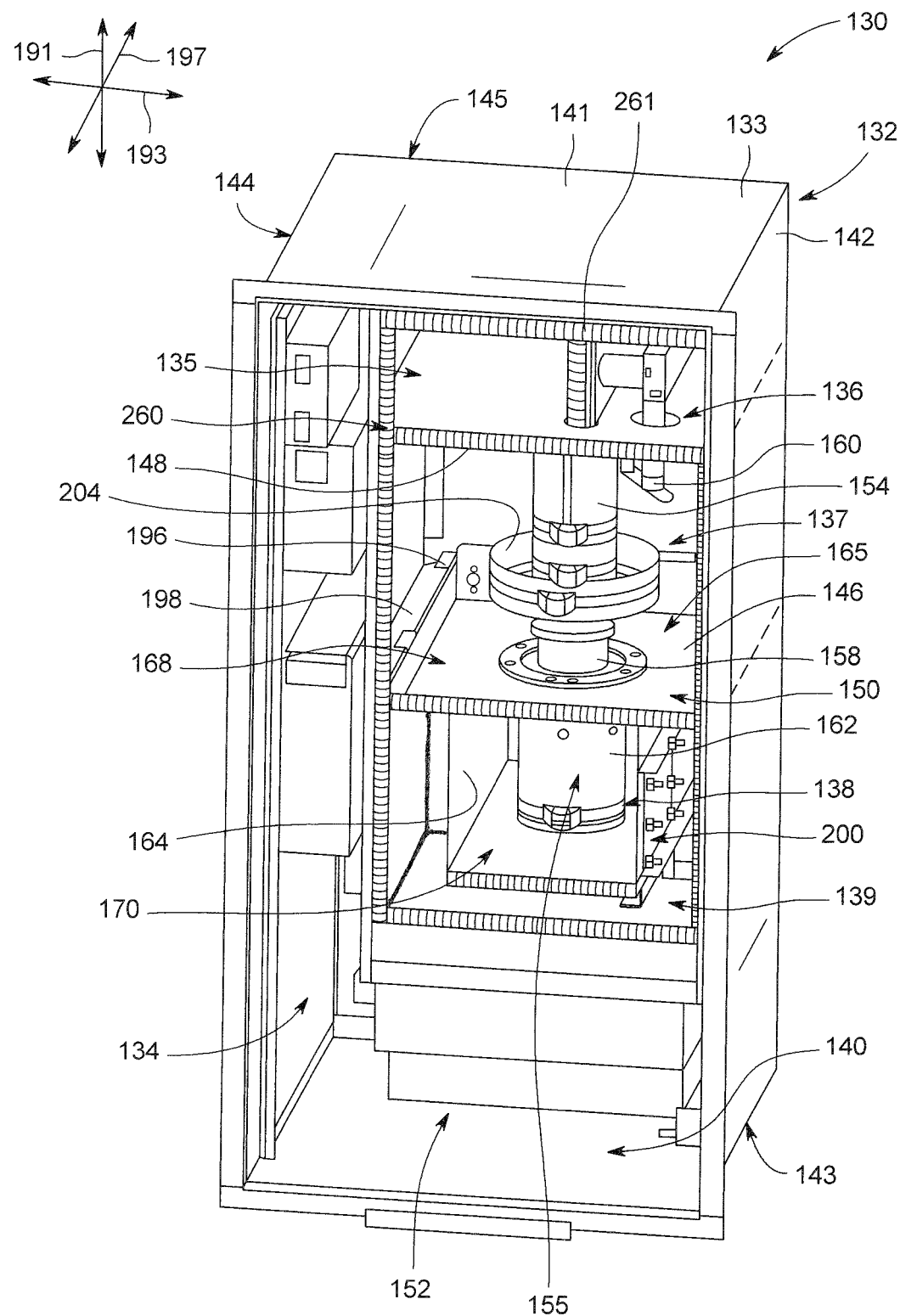
FIG. 3 is a perspective view of a radio frequency (RF) power generator having a tube amplifier system in accordance with an embodiment.

FIG. 3 is a perspective view of a RF power generator 130, which may be used with an isotope production system, such as the isotope production system 100 (FIG. 1). It is contemplated, however, that the RF power generator 130 may be used in other applications that require RF power amplification. The RF power generator 130 may be similar to the RF power generator 106 (FIG. 1) and configured to energize RF electrodes, such as the RF electrodes 126, 128 (FIG. 2). The RF power generator 130 includes a generator housing 132, which may be referred to as a cabinet in some embodiments. The generator housing 132 houses a number of interconnected components of the RF power generator 130 that cooperate in generating a sufficient amount of electric power for operating the RF electrodes.

The generator housing 132 defines a housing cavity 134 that may be divided or apportioned by interior walls to form compartments 135-140. The generator housing 132 may include an outer enclosure 133 having external walls 141-145. In some embodiments, the external walls 141-145 face an exterior space that is readily accessible to individuals and/or that has equipment positioned adjacent to one or more of the external walls 141-145. As such, the generator housing 132 and other internal shielding structures may be configured to obtain a designated electromagnetic compliance (EMC). More specifically, the generator housing 132 may be configured to reduce leakage of electromagnetic energy into the exterior space. Embodiments configured to obtain a designated EMC are described in U.S. patent application Ser. No. 14/575,958, which is incorporated herein by reference in its entirety.

As shown, the RF power generator 130 is oriented with respect to mutually perpendicular axes, including a longitudinal axis 191, a lateral axis 193, and a depth axis 197. The lateral axis 193 extends laterally between the external walls 142, 144. The longitudinal axis 191 may be a vertical axis that extends parallel to the force of gravity, and the depth axis 197 may extend into the housing cavity 134. It is contemplated that the longitudinal axis 191 in other embodiments may not extend parallel to the force of gravity.

The generator housing 132 includes a conductive frame 260 that surrounds and defines openings to the compartments 135-139. The conductive frame 260 may include, for example, flexible conductive elements 261 (e.g., contact springs, spring fingers, and the like) that are configured to engage an access panel 252 (shown in FIG. 9). The compartments 137-139 collectively form an interior space 155 that is configured to receive at least a majority of the primary components of a tube amplifier system 170. As described herein, the tube amplifier system 170 includes a movable tray assembly 165 that may include a plurality of interconnected components of the tube amplifier system 170. The movable tray assembly 165 allows for the components to be assembled, serviced, and/or tested outside of the interior space 155 and then moved, as a unit, into the interior space 155. The movable tray assembly 165 may divide the interior space 155 into the compartments 137-139 when the movable tray assembly 165 is operably positioned within the interior space 155. Moreover, the movable tray assembly 165 may be movable to different levels along the longitudinal axis 191. As described herein, moving the movable tray assembly 165 along the longitudinal axis 191 may effectively change a length of one or more resonators of the tube amplifier system 170. As such, moving the movable tray assembly along the longitudinal axis 191 may be referred to as coarse tuning the tube amplifier system 170. The generator housing 132 may also have an housing door 250 (shown in FIG. 9) that provides general access to the housing cavity 134 and may cover the housing cavity 134 during operation of the RF power generator 130.

The compartment 137 may be hereinafter referred to as an output cavity 137, and the compartment 138 may be hereinafter referred to as a input cavity 138. The compartments 135-140 may be defined by interior conductor walls that are positioned within the housing cavity 134. For example, the interior conductor walls include a grounding deck 146 and a shorting deck 148. The grounding deck 146 is part of the movable tray assembly 165 and separates the output and input cavities 137, 138. The grounding deck 146 may have an input side that faces the input cavity 138 and an output side that faces the output cavity 137. One or more of the conductor walls may include apertures 150 that permit air to flow therethrough. For example, the RF power generator 130 may include a thermal control unit 152 (e.g., air cooling unit) that circulates air within the housing cavity 134.

Operative components of the RE power generator 30 that are disposed within the output cavity 137 may include an output inner conductor 154, a tuning capacitor assembly 204, and a power tube 158. The output cavity 137 may also include an output coupling loop (or pickup loop) 160 therein. The input cavity 138 may be at least partially defined by a conductor sub-assembly 164 and include an input inner conductor 162 therein. In the illustrated embodiment, the conductor sub-assembly 164 is U-shaped and secured to the grounding deck 146. The grounding deck 146 and the conductor sub-assembly 164 may collectively form a support frame 168 of the movable tray assembly 165. As shown, the RF power generator 130 also includes multi-layered decoupling capacitors 200 that are secured to the conductor sub-assembly 164. The decoupling capacitors 200 are described in U.S. application Ser. No. 14/575,885, which is incorporated herein by reference in its entirety.

In some embodiments, the grounding deck 146, the power tube 158, the input inner conductor 162, the conductor sub-assembly 164, and/or the tuning capacitor assembly 204 may form the movable tray assembly 165. The movable tray assembly 165 may be secured to the output inner conductor 154, the decoupling capacitors 200, cooling tubes (not shown), and a supply cable (not shown) to form a tube amplifier system 170. In an exemplary embodiment, the tube amplifier system 170 includes the support frame 168, the power tube 158, the tuning capacitor assembly 204, the decoupling capacitors 200, the input inner conductor 162, the output inner conductor 154, the coupling loop 160, and outer conductors 234, 236 (shown in FIG. 9) formed by the RF power generator 130. The tube amplifier system 170 may include fewer or more components in other embodiments.

In an exemplary embodiment, the power tube 158 is a power triode that includes a cathode, anode, and control grid (not shown). The cathode may be heated by a filament that receives current from a power supply (not shown). The heated filament causes the cathode to emit electrons, which flow through the power tube 158 toward the anode. The control grid is positioned between the cathode and anode and may be used to control the flow of the electrons. Although the power tube 158 is a power triode in some embodiments, it should be understood that other power tubes may be used, such as tetrodes or pentodes.

Figure 4:
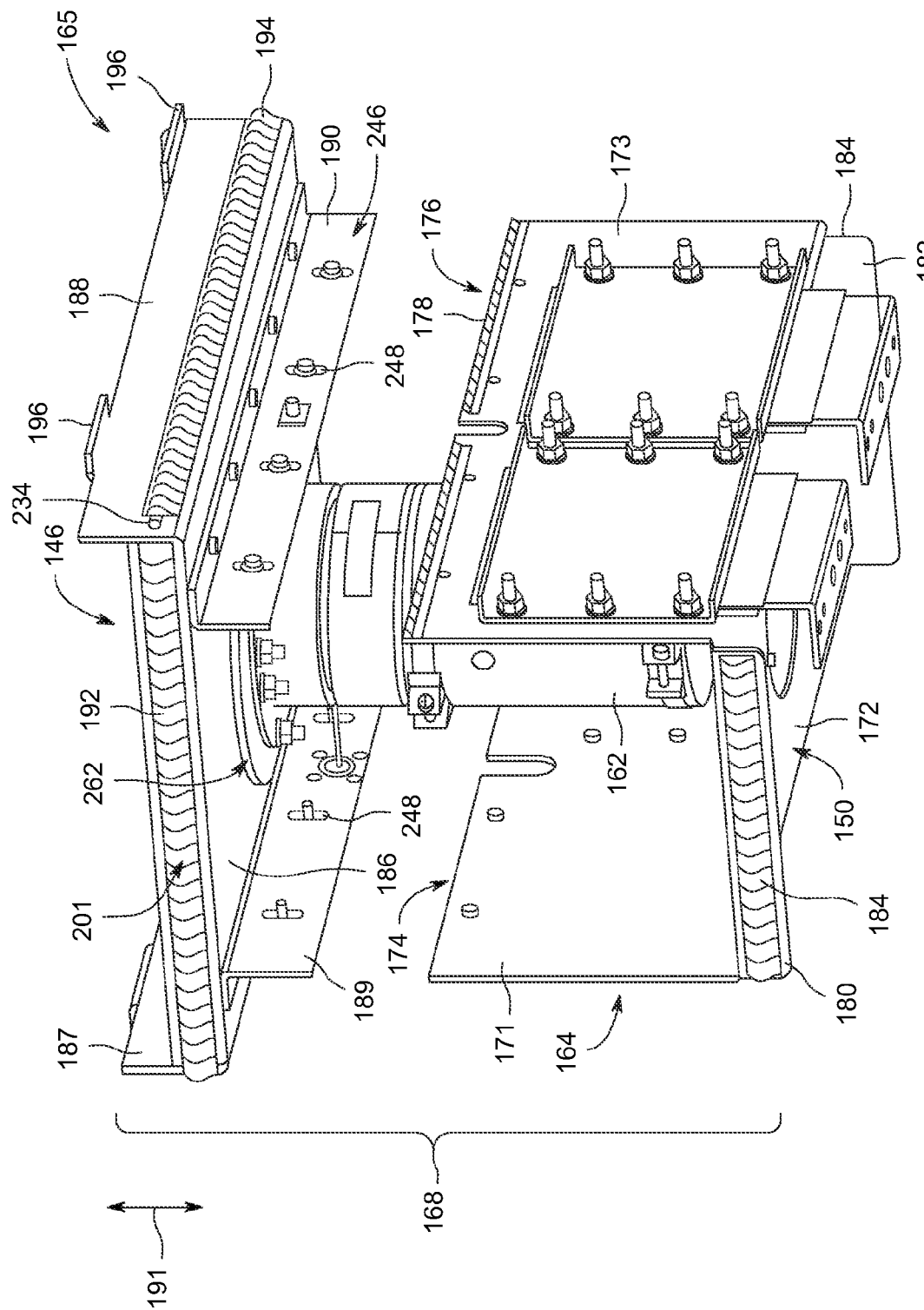
FIG. 4 is a partially exploded view of a movable tray assembly formed in accordance with an embodiment.

FIG. 4 is a partially exploded view of the movable tray assembly 165 in accordance with an embodiment. It should be understood that FIG. 4 and the accompanying description illustrate just one example of a movable tray assembly and that other embodiments may be assembled in accordance with the teachings herein. As shown in FIG. 4, the grounding deck 146 and the conductor sub-assembly 164 have been separated. The movable tray assembly 165 may include the input inner conductor 162 and a multi-disc capacitor 262 that couples the input inner conductor 162 to the grounding deck 146. The capacitor 262 is described in greater detail in U.S. application Ser. No. 14/575,914, which is incorporated herein by reference in its entirety.

The conductor sub-assembly 164 may include a plurality of ground walls 171-173. In the illustrated embodiment, the ground walls 171-173 form a U-shaped structure, but other shapes may be formed by the ground walls 171-173. The ground wall 172 extends between and joins the ground walls 171, 173 and includes a plurality of the apertures 150 for airflow. The ground walls 171, 173 may project away from the input side of the grounding deck 146. The ground wall 172 is configured to electrically couple to the input inner conductor 162. The ground walls 171, 173 may include coupling edges 174, 176, respectively, that are configured to electrically couple to the grounding deck 146. For example, the ground walls 171, 173 may include conductive elements 178 along the coupling edges 174, 176.

Also shown in FIG. 4, the conductor sub-assembly 164 may include a front grounding panel 180 and a rear grounding panel 182 that each include a plurality of flexible conductive elements 184. The conductive elements 184 along the front grounding panel 180 may be configured to engage the access panel 252 (FIG. 9), and the conductive elements 184 along the rear grounding panel 182 may be configured to engage an interior surface of a conductor wall 222 (shown in FIG. 7). For example, conductive elements may include elongated bodies (e.g., beams) that are configured to resiliently flex when engaging another component. When engaged to the other component, the conductive elements may have a stored energy that continuously biases the conductive element against the other component so that the conductive elements contact and remain engaged to the other component during operation of the RF power generator 130 (FIG. 3).

Figure 9:
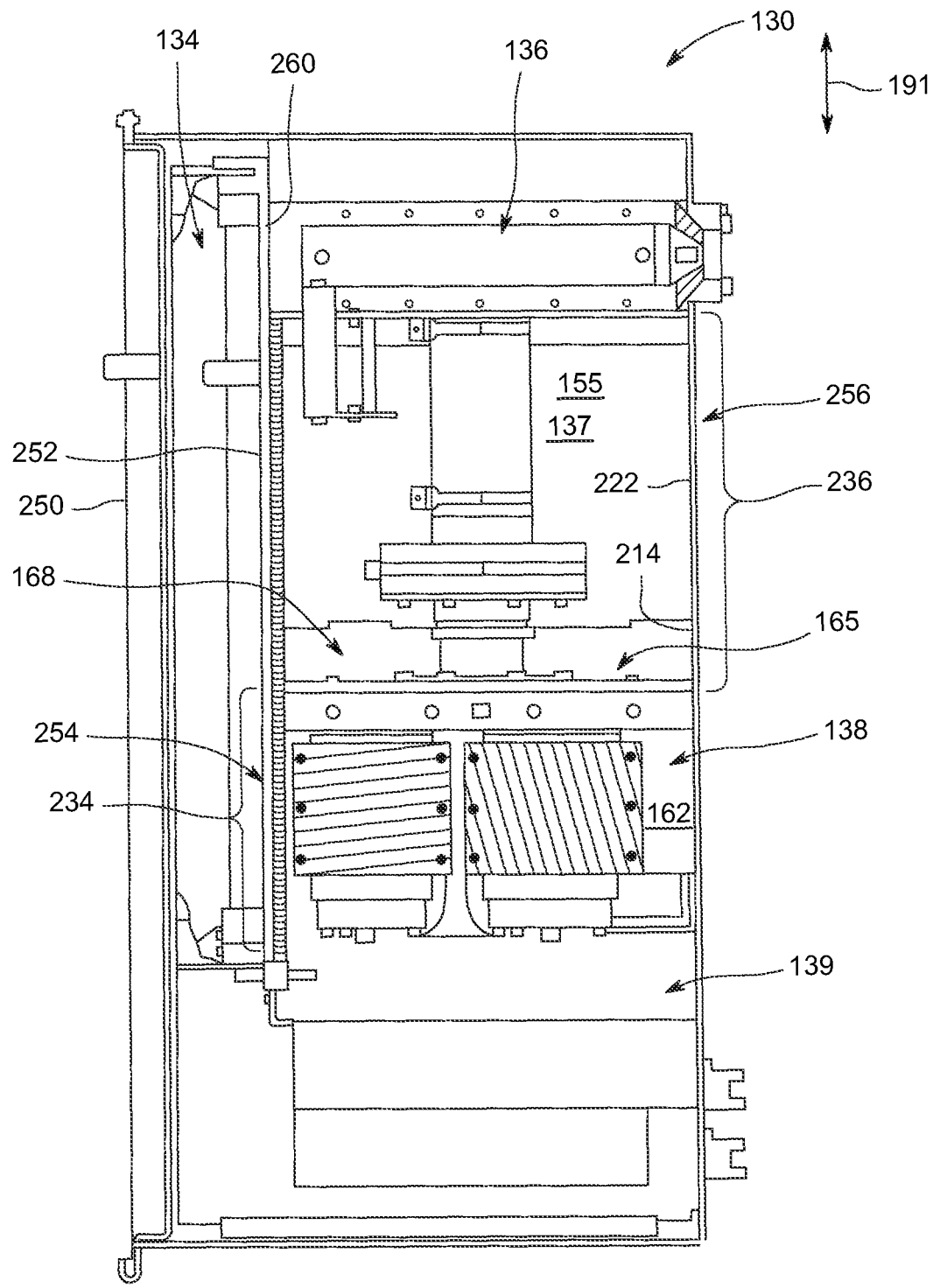
FIG. 9 is a side cross-section of the RF power generator of FIG. 3.

The grounding deck 146 includes a base plate 186, a pair of sidewalls 187, 188, and a pair of structure supports 189, 190. The base plate 186 includes flexible conductive elements 192 positioned along a front end 201 of the grounding deck 146 that are configured to engage the access panel 252 (FIG. 9). Also shown, the sidewall 188 may have a mounting hole 324 that is proximate to the front end 201. The sidewall 187 may also include a mounting hole 322 (shown in FIG. 5). The grounding deck 146 may also include conductive elements 195 (shown in FIG. 6) along a back end that are configured to engage an interior surface of the generator housing 132. Likewise, the sidewall 188 may include conductive elements 194 positioned therealong that are configured to engage an interior surface of the generator housing 132. The sidewall 187 may also include conductive elements 194 (shown in FIG. 5) positioned therealong for engaging another interior surface of the generator housing 132.

The structure supports 189, 190 are secured to the base plate 186 and are configured to couple to the ground walls 171, 173, respectively. The conductive elements 178 may engage the structure supports 189, 190. The structure supports 189, 190 may be L-shaped. In an exemplary embodiment, the conductor sub-assembly 164 is capable of being positioned at different distances with respect to the grounding deck 146. For example, the movable tray assembly 165 includes hardware 246 and slots 248 that receive the hardware 246. The hardware 246 is used to secure the ground walls 171, 173 to the structure supports 189, 190, respectively. The ground walls 171, 173 include corresponding holes that receive the hardware 246. As shown, the slots 248 extend lengthwise along the longitudinal axis 191. The slots 248 permit the conductor sub-assembly 164 to be positioned at different distances relative to the grounding deck 146. In particular, the shorting deck 172 may be positioned at different distances with respect to the grounding deck 146 to change a length of the input cavity 138 (FIG. 3).

Accordingly, the support frame 168 may provide conductive paths that extend from the ground walls 171, 173 to one or more of the conductive elements 184, 192, and 194 and, consequently, to the generator housing 132. The ground walls 171, 173 may be configured to electrically ground the decoupling capacitors 200. Moreover, the ground walls 171, 173 may form part of the outer conductor 234 of the input resonator 254.

Also shown in FIG. 4, the support frame 168 may include blocking tabs 196 that extend laterally away from the sidewalls 187, 188. Returning to FIG. 3, when the movable tray assembly 165 is positioned within the interior space 155, the movable tray assembly 165 is positioned between a ledge support 198 and a ledge support 199 (FIG. 7) of the generator housing 132. For example, the grounding deck 146 may extend between and be electrically coupled to inner surfaces of the ledge supports 198, 199. During the positioning process, the movable tray assembly 165 may be initially positioned above the ledge supports 198, 199 and then lowered in a direction along the longitudinal axis 191 such that a portion of the movable tray assembly 165 extends between the ledges supports 198, 199. The blocking tabs 196 may be configured to prevent the movable tray assembly 165 from moving completely through the opening between the ledge supports 198, 199. In alternative embodiments, the blocking tabs 196 may not be used and, instead, the ledge supports 198, 199 may include tabs that prevent the movable tray assembly 165 from moving completely through the opening between the ledge supports 198, 199.

Figure 5:
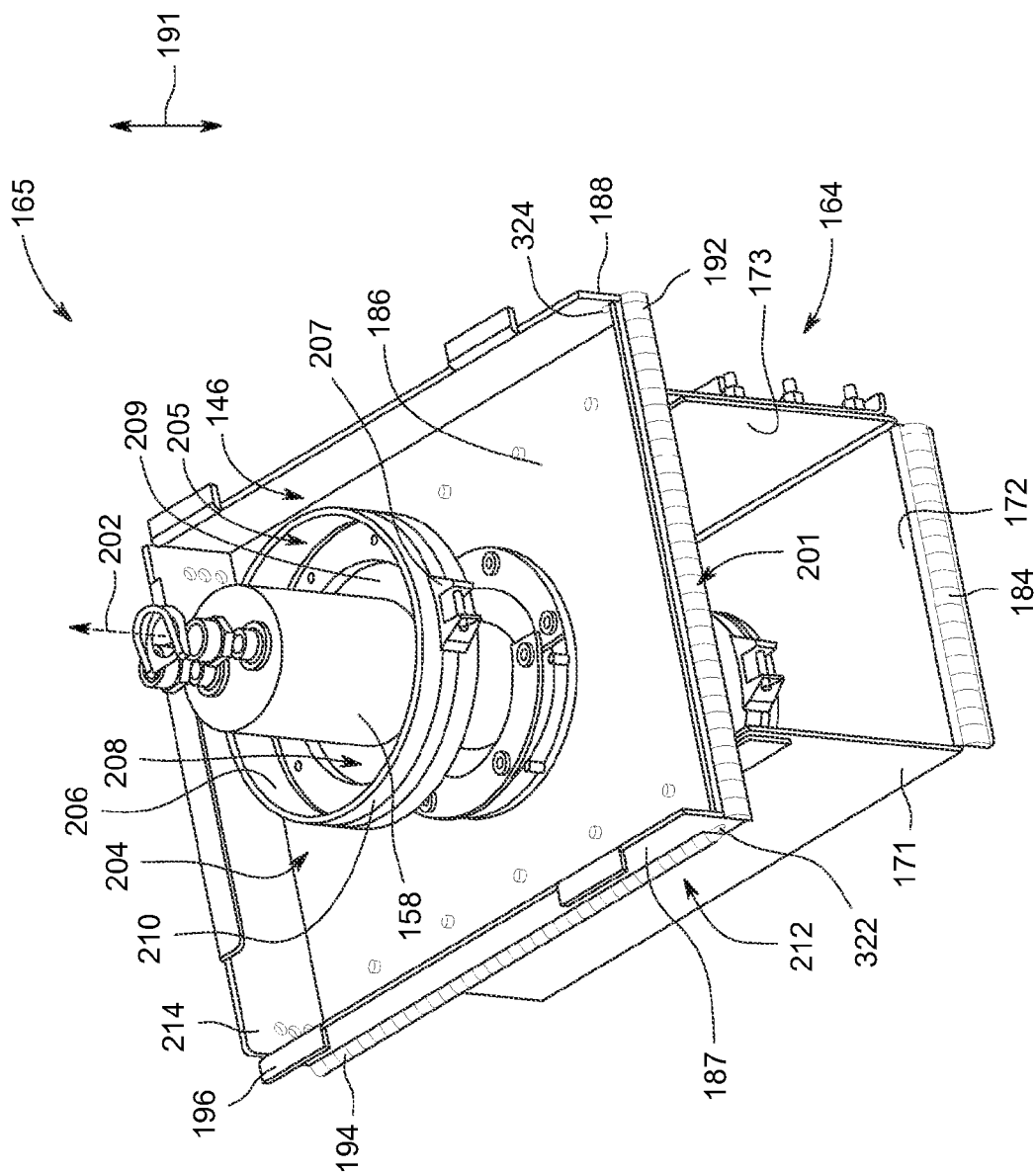
FIG. 5 is perspective view of the movable tray assembly of FIG. 4 including a tuning capacitor assembly formed in accordance with an embodiment.

FIG. 5 is a top perspective view of the movable tray assembly 165. As shown, a central axis 202 extends parallel to the longitudinal axis 191 and through a geometric center of the power tube 158. The base plate 186 of the grounding deck 146 and the shorting deck 172 extend transverse (or perpendicular) to the central axis 202. The ground walls 171, 173 and the sidewalls 187, 188 extend parallel to the central axis 202. The central axis 202 may also extend through centers of an output resonator 256 (shown in FIG. 9) and a input resonator 254 (shown in FIG. 9) that are partially defined by the movable tray assembly 165.

Also shown, the movable tray assembly 165 includes the tuning capacitor assembly 204. The tuning capacitor assembly 204 may be used to fine tune the tube amplifier system 170 (FIG. 3) and, in particular, the output resonator 256. In the illustrated embodiment, the tuning capacitor assembly 204 includes an output connector 205 having a connector wall 206 that surrounds the central axis 202 and defines a thru-hole 208 that receives the power tube 158. Optionally, the output connector 205 is mounted onto an anode electrode 209 of the power tube 158. The tuning capacitor assembly 204 also includes a tuning sheet 210 that surrounds the central axis 202 and interfaces with the connector wall 206. The tuning sheet 210 may be held against the connector wall 206 using a fastener, such as a belt 207.

In the illustrated embodiment, the tuning sheet 210 is located along an exterior of the connector wall 206. In other embodiments, the tuning sheet 210 may be located along an interior of the connector wall 206. As described herein, the tuning sheet 210 may be movable along the central axis 202 to adjust an amount of combined capacitive surface that is exposed within the output resonator 256 (FIG. 9). Adjusting the amount of the combined capacitive surface may be at least one process used to fine tune the tube amplifier system 170 and, in particular, the output resonator 256. In an exemplary embodiment, the tuning capacitor assembly 204 is an annular capacitor assembly in which both the output connector 205 and the tuning sheet 210 are annular or ring-shaped. It is contemplated that the tuning capacitor assembly 204 may have other shapes in alternative embodiments.

The movable tray assembly 165 includes exterior or outer surfaces that are electrically conductive and configured to engage conductor walls of the RF power generator 130 when the movable tray assembly 165 is positioned within the interior space 155 (FIG. 3). For example, the exterior surfaces may be formed by the conductive elements 178, 184, 192, 194, and 195. The exterior surfaces may also be formed by sidewalls or panels that directly engage the conductor walls of the RF power generator. The grounding deck 146 may have a perimeter 212 that surrounds the grounding deck 146 (or the base plate 186). In some embodiments, the perimeter 212 may represent the most lateral or radial portions of the grounding deck 146 with respect to the central axis 202, except for the blocking tabs 196. The conductive elements 192, 194 may form the perimeter 212. The perimeter 212 is configured to extend alongside and engage conductor walls 221-223 that define an outer conductor 236 (FIG. 9) of the output resonator 256 (FIG. 9). The conductive elements 184 are configured to engage conductor walls that partially define an outer conductor 234 of the input resonator 254 (FIG. 9).

Figure 6:
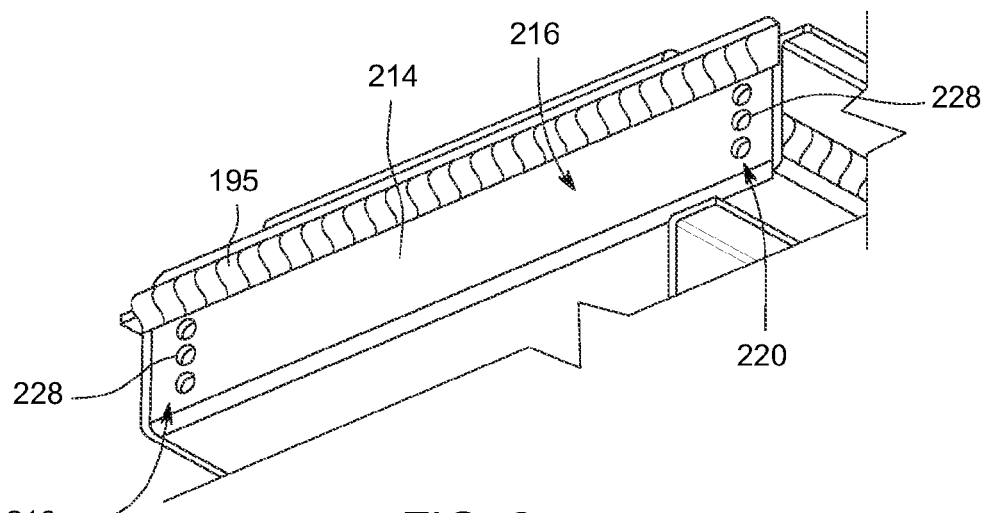
FIG. 6 illustrates a back surface of a securing panel of the movable tray assembly of FIG. 4.

Also shown in FIG. 5, the grounding deck 146 may include a securing panel 214 that is coupled to the base plate 186 and, optionally, the sidewalls 187, 188. The securing panel 214 is also shown in FIG. 6. The securing panel 214 includes an outer surface 216 that is configured to interface with a conductor wall of the RF power generator 130. As used herein, the term "interface" includes two elements directly engaging each other and/or facing each other with a small gap therebetween. A row of the conductive elements 195 are positioned laterally along the outer surface 216. In certain embodiments, the securing panel 214 is configured to removably mount to the conductor wall 222. For example, the securing panel 214 includes at least one opening that is configured to receive hardware for removably mounting the securing panel 214 to the conductor wall 222. In the illustrated embodiment, the securing panel 214 includes a plurality of columns 218, 220 of mounting holes 228. Each of the mounting holes 228 is sized and shaped to receive, for example, a single nut or bolt. Each mounting hole 228 may be co-planar with respect to another mounting hole 228 in the opposite column. In an exemplary embodiment, each mounting hole 228 is spaced apart from adjacent mounting hole(s) 228 of the same column by about 10 millimeters (mm).

Returning to FIG. 5, the base plate 186, the sidewalls 187, 188, and the securing panel 214 of the grounding deck 146 may be formed from a common sheet of conductive material (e.g., sheet metal). For example, a planar piece of sheet metal may be stamped or otherwise manufactured to include the base plate 186, the sidewalls 187, 188, and the securing panel 214. The sidewalls 187, 188 and the securing panel 214 may be formed by bending or folding the sheet metal so that the sidewalls 187, 188 and the securing panel 214 extend perpendicular to the base plate 186. Likewise, the conductor sub-assembly 164 may be formed from a common sheet of conductive material that is folded to form the ground walls 171-173.

In some embodiments, the movable tray assembly 165 may also be coupled to the generator housing 132 proximate to the front end 201 of the grounding deck 146. For example, the mounting holes 322, 324 of the sidewalls 187, 188, respectively, are configured to receive hardware (not shown) to secure the movable tray assembly 165 along the front end 201. The mounting holes 322, 324 may be used to secure the movable tray assembly 165 to the ledge supports 198, 199, respectively. By way of example, the mounting holes 322, 324 may align with holes (not shown) of the ledge supports 198, 199, respectively. Hardware (e.g., bolts) may be inserted through the aligned holes to secure the sidewalls 187, 188 to the respective ledge supports 198, 199. Alternatively, the movable tray assembly 165 may be mounted to an access panel 252 (FIG. 9) or other structure of the generator housing 132.

Figure 7:
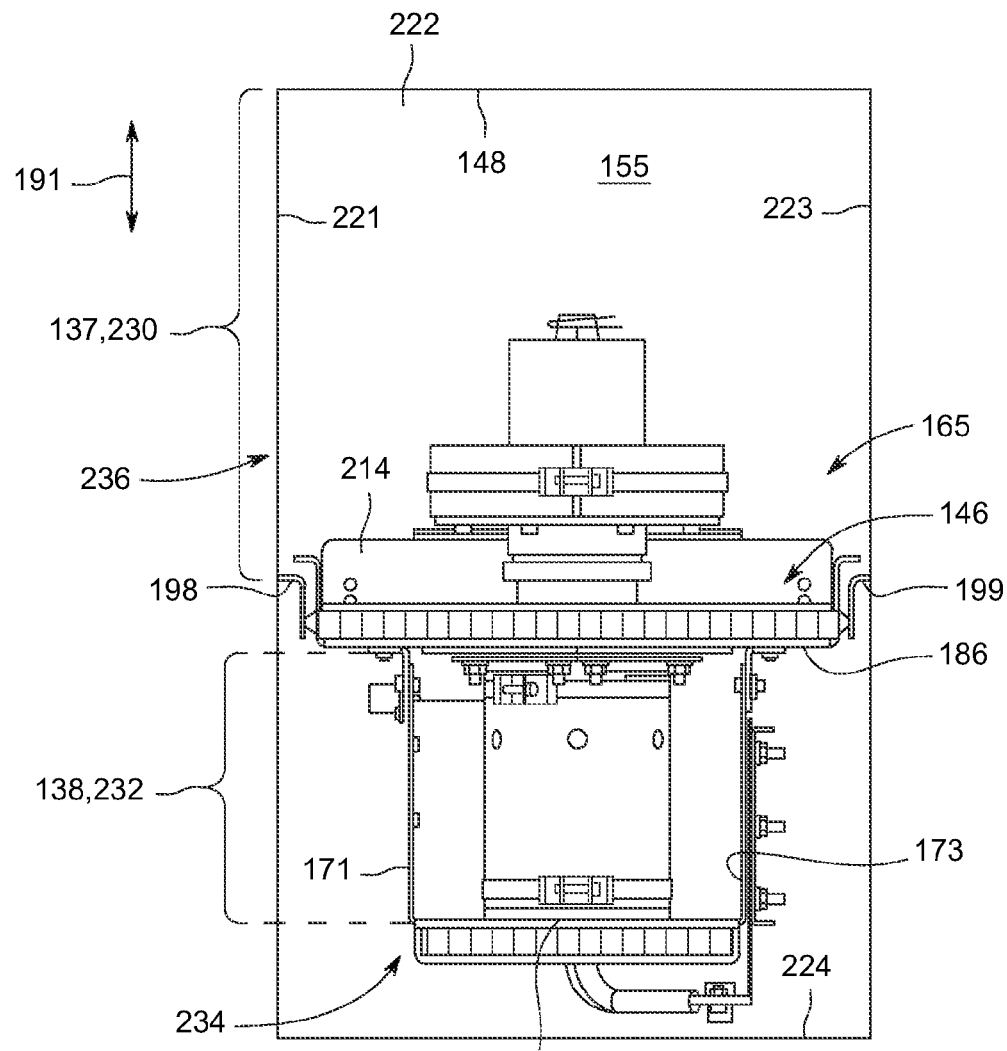
FIG. 7 is a front end view of the movable tray assembly of FIG. 4 within an interior space defined by conductor walls.

FIG. 7 is a front view of the movable tray assembly 165 positioned within the interior space 155. For illustrative purposes, other components of the tube amplifier system 170 (FIG. 3) have been removed, such as the coupling loop 160 (FIG. 3) and the inner conductor 154 (FIG. 3). The interior space 155 is defined by a plurality of conductor walls 221-223 that extend parallel to the longitudinal axis 191, a bottom wall 224, and the output shorting deck 148. The output shorting deck 148 and the bottom wall 224 extend transverse (or perpendicular) to the longitudinal axis 191.

After the movable tray assembly 165 is positioned within the interior space 155, an access panel or wall 252 (FIG. 9) may be positioned in front of the movable tray assembly 165 and engage edges of the conductor walls 221-223, the shorting deck 225, and, optionally, the bottom wall 224.

When the movable tray assembly 165 and the access panel 252 are operably positioned, the output cavity 137 and the input cavity 138 are formed. More specifically, the output cavity 137 may be defined as the space that extends longitudinally between the output shorting deck 148 and the grounding deck 146 and laterally or radially between the conductors walls 221-223 and the access panel 252. The output shorting deck 148 and the grounding deck 146 define a length 230 of the output cavity 137 (or the output resonator 256) therebetween.

The input cavity 138 may be defined as the space that extends longitudinally between the input shorting deck 172 and the base plate 186 and laterally or radially between the ground walls 171, 173, the access panel 252, and the conductor wall 222. The conductor wall 222 may form a back or rear boundary of the input shorting deck 172. The conductor wall 222 may be referred to as a mounting wall. The access panel 252 may form the front boundary of the input shorting deck 172. The input shorting deck 172 and the grounding deck 146 define an input length 232 of the input cavity 138 (or the input resonator 254) therebetween. In particular embodiments, the input length 232 is fixed when the movable tray assembly 165 is moved for positioning within the interior space 155. More specifically, the input shorting deck 172 and the ground walls 171, 173 move with the movable tray assembly 165 as a unit when the movable tray assembly 165 is moved for positioning within the interior space 155. The input length 232 may be, for example, between 5 centimeters (cm) and 15 cm.

When the movable tray assembly 165 and the access panel 252 are operably positioned, the ground walls 171, 173, the access panel 252, and the conductor wall 222 form an outer conductor 234 of the input resonator 254. The outer conductor 234 may have the input length 232. Likewise, when the movable tray assembly 165 and the access panel 252 are operably positioned, the access panel 252 and the conductor walls 221-223 form an outer conductor 236 of the output resonator 256. The outer conductor 236 may have the output length 230.

The output length 230, however, is capable of being adjusted or changed by re-positioning the movable tray assembly 165. More specifically, the movable tray assembly 165 is capable of being positioned at multiple different levels along the longitudinal axis 191. Each level may have a corresponding axial position with respect to the longitudinal axis 191 or a corresponding depth relative to the output shorting deck 148. As used herein, the phrase "multiple different levels" includes discrete levels that are separate or spaced apart from each other, such that the movable tray assembly may have only a limited number of positions. However, the phrase "multiple different levels" may also include levels that are located along a continuous range, such that the movable tray assembly 165 may be positioned at any position between a maximum and minimum value of the range. In such embodiments, the movable tray assembly 165 may be slidable along at least one of the conductors walls 221-223.

As set forth herein, the movable tray assembly 165 may be removably mounted to at least one of the conductor walls 221-223. In the illustrated embodiment, the movable tray assembly 165 is removably mounted to the conductor wall 222. However, the movable tray assembly 165 may be removably mounted to the conductor wall 221 or the conductor wall 223 in other embodiments. Moreover, in the illustrated embodiment, the securing panel 214 is configured to be secured to the conductor wall 222 using hardware 240 (shown in FIG. 8).

As used herein, the phrase "removably mounted" means that a first component may be readily mounted and demounted with respect to a second component without destroying the first component or the second component. When mounted to the second component, the first component may have a fixed position with respect to the second component and have a designated or desired orientation with respect to the second component or other components. When demounted with respect to the second component, the first component is at least movable with respect to the second component. For example, when the movable tray assembly is demounted from the conductor wall(s), the movable tray assembly may be moved for positioning the movable tray assembly at one of a plurality of possible levels within the interior space. In some embodiments, the first component may not be completely separated from the second component when demounted from the second component. For example, the first component may be permitted to slide to another position with respect to the second component.

As used herein, the phrase "readily mounted and demounted" means the first component may be mounted to and demounted from the second component without undue effort or a significant amount of time spent in mounting or demounting. For example, the components may be coupled to one another using a limited amount of hardware, such as fasteners, screws, latches, buckles, nuts, bolts, washers, and the like, such that a technician may couple or uncouple the two components using only hands of the technician and/or tools (e.g., wrench). In some circumstances, more than one technician may perform the mounting or demounting process. In some embodiments, components that are removably mounted to each other may be coupled without hardware, such as by forming an interference or snap fit with respect to one another.

The components in the above examples may be the movable tray assembly 165 and at least one of the conductor walls 221-223. In some embodiments, the movable tray assembly 165 may be mounted to at least one conductor wall within a commercially reasonable period of time. For example, the movable tray assembly 165 may be mounted to at least one conductor wall such that the movable tray assembly 165 is secured to the conductor wall(s) in a fixed and desired position in less than ten (10) minutes. In particular embodiments, the movable tray assembly 165 may be mounted to at least one conductor wall such that the movable tray assembly 165 is secured to the conductor wall(s) in the fixed and desired position in less than five (5) minutes or, more particularly, in less than three (3) minutes. In more particular embodiments, the movable tray assembly 165 may be mounted to at least one conductor wall in the fixed and desired position in less than two (2) minutes or, more particularly, in less than one (1) minute. Likewise, the movable tray assembly 165 may be demounted from the conductor wall(s) in less than ten minutes, less than five minutes, less than three minutes, less than two minutes, or less than one minute.

Accordingly, the movable tray assembly 165 may be moved to different levels along the longitudinal axis 191. When the movable tray assembly 165 is moved toward the output shorting deck 148 or further from the output shorting deck 148, the output length 230 is effectively changed. The performance of a resonator is based, in part, on the dimensions of the inner and outer conductors and the output cavity. Changing the designated level of the grounding deck 146, effectively tunes the output resonator 256. This procedure (e.g., moving the movable tray assembly 165 or the grounding deck 146 along the longitudinal axis 191) may be referred to as coarse tuning. As set forth herein, dimensions of the input resonator 254 may already be fixed or set when the movable tray assembly 165 is moved along the longitudinal axis 191.

Figure 8:
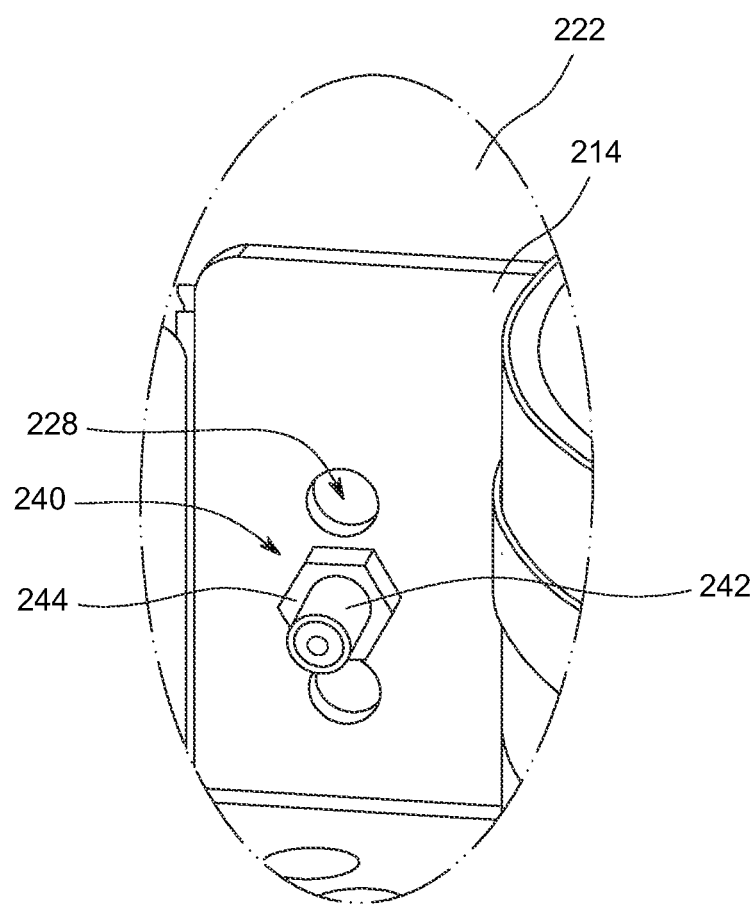
FIG. 8 is an enlarged view of a mechanism for mounting the movable tray assembly to at least one of the conductor walls.

FIG. 8 is an enlarged view of a portion of the securing panel 214 secured to the conductor wall 222 such that the movable tray assembly 165 (FIG. 7) is mounted to the conductor wall 222. FIG. 8 illustrates only one mechanical connection between the securing panel 214 and the conductor wall 222. More specifically, the hardware 240 includes a bolt 242 that extends through the middle mounting hole 228 of the column 220 and a nut 244 that is coupled to the bolt 242. The bolt 242 may extend from an exterior of the RF power generator 130, through the conductor wall 222, and through the middle mounting hole 228 of the securing panel 214. When the nut 244 is secured, the nut 244 and the bolt 242 may generate opposite compressive forces and effectively grip the ground wall 222 and the securing panel 214 therebetween. A similar mechanical connection (or connections) may be made elsewhere between the movable tray assembly 165 and the conductor wall 222. In particular embodiments, two such mechanical connections are formed. For example, one of the mounting holes 228 of the column 218 may receive corresponding hardware 240 and the same mounting hole 228 of the column 220 may receive corresponding hardware 240. However, alternative mechanisms may be used for coupling the securing panel 214 to the conductor wall 222. For example, the conductor wall 222 may include integrated elements that are sized and shaped to be received by the mounting holes 228.

FIG. 9 is a side cross-sectional view of the RF power generator 130 when fully assembled. As shown, the generator housing 132 includes the housing door 250 and the access panel 252. The access panel 252 is positioned within the housing cavity 134 alongside the conductive frame 260 that defines openings to the compartments 135-139. The access panel 252 mechanically and electrically engages the conductive frame 260 and covers the openings to the compartments 135-139. The compartment 135 is not shown in FIG. 9. After the movable tray assembly 165 is positioned within the interior space 155 and mounted to the conductor wall 222, the access panel 252 may be mechanically and electrically coupled to the conductive frame 260. For example, the access panel 252 may engage conductive elements of the conductive frame 260. When the access panel 252 and the movable tray assembly 165 are operably positioned as shown in FIG. 9, the input and output cavities 138, 137 and the outer conductors 234, 236 of the input and output resonators 254, 256, respectively, are formed.

Figure 10:
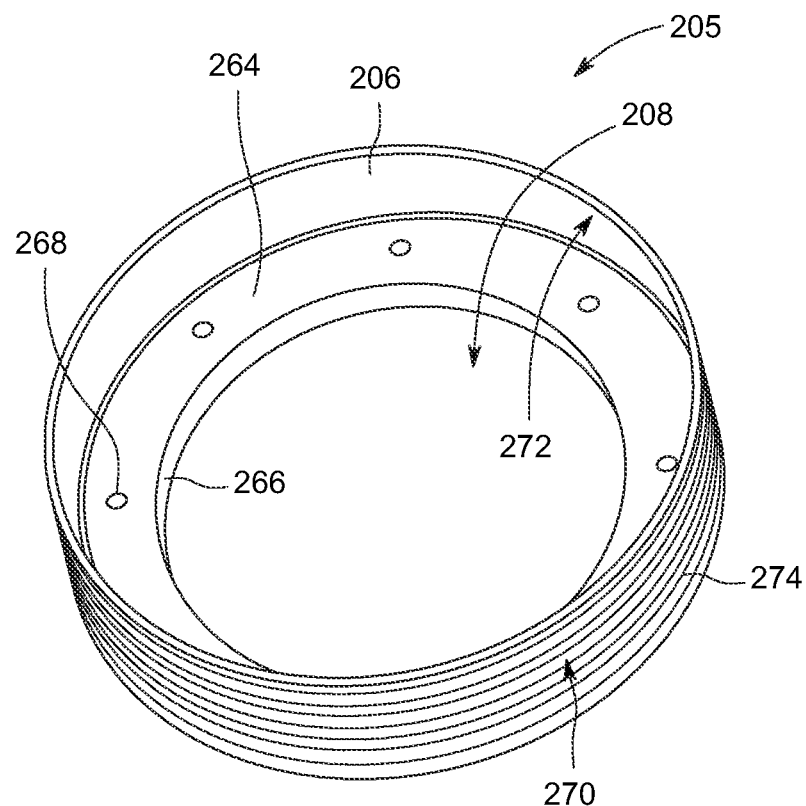
FIG. 10 is an isolated perspective view of a output connector that may be used with the tuning capacitor assembly of FIG. 5.

FIGS. 10-13 illustrate the tuning capacitor assembly 204 (FIG. 5) in greater detail. FIG. 10 is an isolated perspective view of the output connector 205. The output connector 205 is configured to be DC-isolated with respect to the output inner conductor 154 (FIG. 3). For example, a insulated foil (e.g., Kapton foil) may be wrapped around the power tube 158 and positioned between the power tube 158 and the output connector inner conductor 154. In the illustrated embodiment, the output connector 205 is mounted onto the anode electrode 209 (FIG. 5) of the power tube 158. In alternative embodiments, the output connector 205 may be mounted to an open end of the output inner conductor 154.

In the illustrated embodiment, the output connector 205 includes the connector wall 206 and a radial wall 264. The radial wall 264 is coupled to the connector wall 206 and extends radially-inward from the connector wall 206 toward the central axis 202 (FIG. 6). The radial wall 264 has an inner edge 266 that defines a size and shape of the thru-hole 208. The thru-hole 208 is configured to receive a portion of the power tube 158 (FIG. 3) therethrough. The radial wall 264 may also include openings 268 for receiving hardware (not shown) for securing the output connector 205 to the movable tray assembly 165. In particular embodiments, the output connector 205 is coupled directly to the power tube 158.

The connector wall 206 includes an outer side 270 that faces outward away from the central axis 202 and an inner side 272 that faces inward toward the central axis 202. The outer and inner sides 270, 272 face in opposite directions. Optionally, the connector wall 206 may include reference markers 274 that are visible features and/or morphological features along the connector wall 206. The reference markers 274 may be positioned along the outer side 270. By way of example, the reference markers 274 may be a series of annular grooves 276 (shown in FIG. 13). The grooves 276 are parallel to each other and surround the central axis 202. In alternative embodiments, the reference markers 274 may not be morphological features. Instead, the reference markers 274 may be a series of lines that are painted, drawn, or otherwise visible along the outer side 270.

Figure 11:
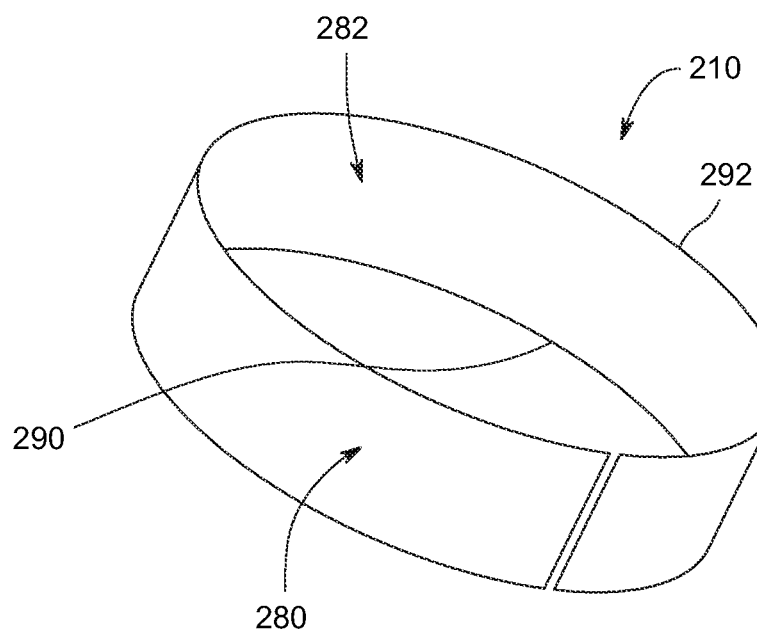
FIG. 11 is an isolated perspective view of a tuning sheet that may be used with the tuning capacitor assembly of FIG. 5.
Figure 12:
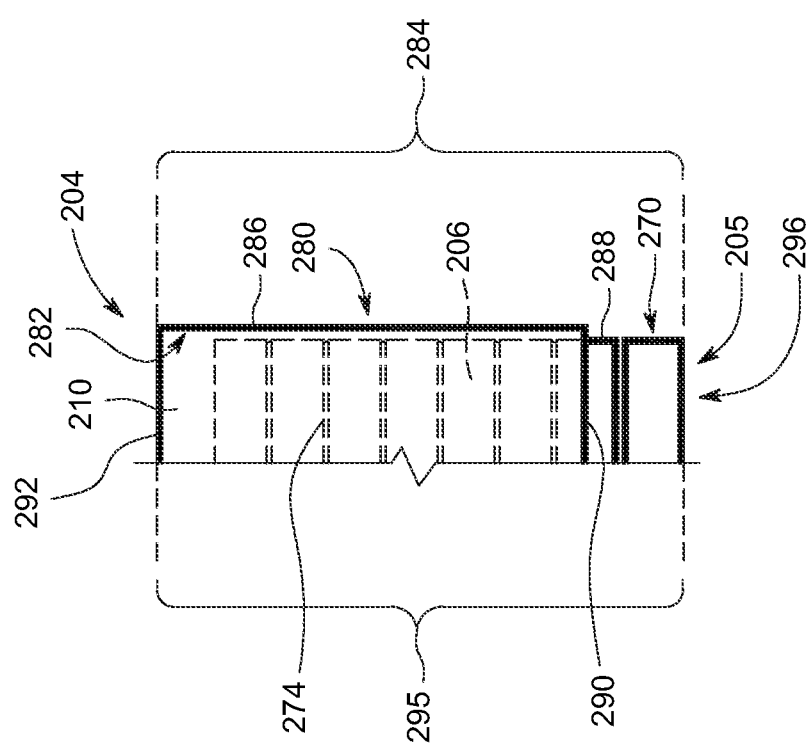
FIG. 12 is an enlarged side view of a portion of the tuning capacitor assembly showing the tuning sheet in a first axial position.

FIG. 11 is an isolated perspective view of the tuning sheet 210. The tuning sheet 210 may be a single piece of conductive sheet material (e.g., aluminum sheet metal) that is stamped and formed to have the shape shown in FIG. 11. The tuning sheet 210 is shaped as a band or ribbon that extends between a bottom edge 290 and a top edge 292. The tuning sheet 210 includes an outer side 280 that is configured to face outward away from the central axis 202, and an inner side 282 that is configured to face inward toward the central axis 202. As shown in FIGS. 11 and 12, the output connector 205 and the tuning sheet 210 are substantially annular or ring-shaped. It is contemplated, however, that the output connector 205 and/or the tuning sheet 210 may have other sizes and shapes in alternative embodiments.

Figure 13:
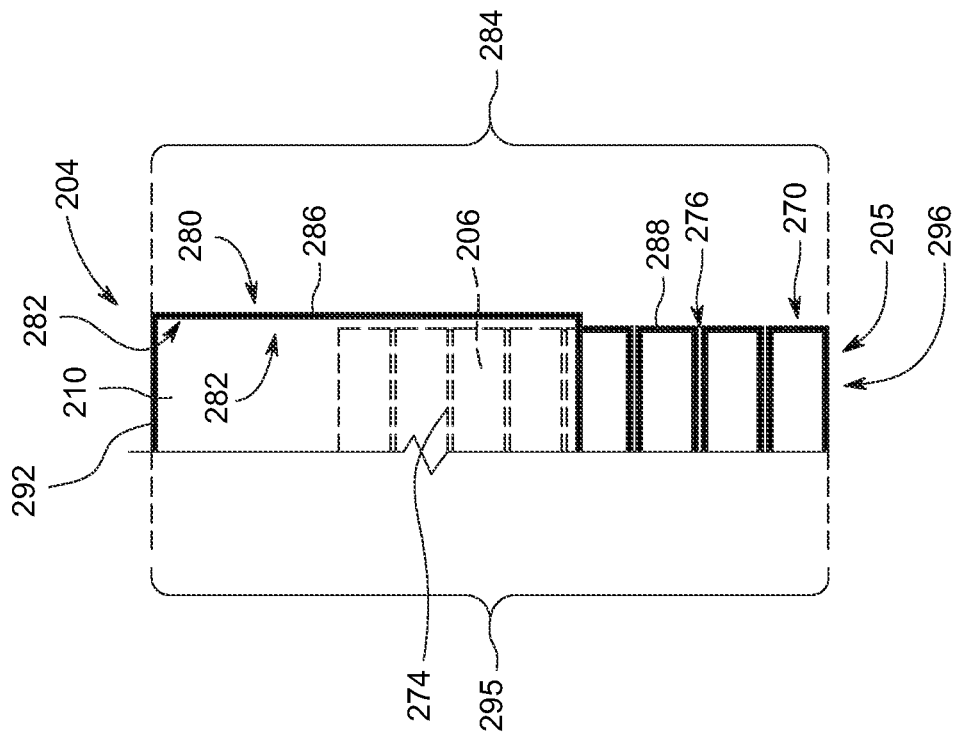
FIG. 13 is an enlarged side view of a portion of the tuning capacitor assembly showing the tuning sheet in a second axial position.

FIGS. 12 and 13 illustrate a portion of the tuning capacitor assembly 204 in which the tuning sheet 210 has different positions relative to the output connector 205 or, more specifically, the connector wall 206. In the illustrated embodiment, the tuning sheet 210 is wrapped about the connector wall 206 such that the inner side 282 of the tuning sheet 210 interfaces with the outer side 270 of the connector wall 206. In other embodiments, however, the tuning sheet 210 may be positioned within the output connector 205 such that the outer side 280 of the tuning sheet 210 interfaces with the inner side 272 (FIG. 10) of the connector wall 206.

In some embodiments, the tuning sheet 210 is movable with respect to the connector wall 206 between designated axial positions. Each axial position may correspond to a different height 295 of the tuning capacitor assembly 204 that is measured along the central axis 202 (FIG. 5) or the longitudinal axis 191 (FIG. 3). The height 295 may be measured between the top edge 292 of the tuning sheet 210 to a bottom 296 of the output connector 205. For example, the tuning sheet 210 has a first axial position in FIG. 12 and a second axial position in FIG. 13. As shown in FIGS. 12 and 13, the tuning sheet 210 and the output connector 205 may combine to form a combined capacitive surface 284. The combined capacitive surface 284 includes an exposed surface portion 286 from the tuning sheet 210 and an exposed surface portion 288 from the connector wall 206.

As the tuning sheet 210 is moved relative to the connector wall 206 along the central axis 202, the combined capacitive surface 284 changes. For example, as the tuning sheet 210 is moved from the first axial position in FIG. 12 to the second axial position in FIG. 13, the exposed surface portion 288 of the connector wall 206 increases and, consequently, the combined capacitive surface 284 increases in area. The increase in area corresponds to an increase in capacitance. As the tuning sheet 210 is moved from the second axial position in FIG. 13 to the first axial position in FIG. 12, the exposed surface portion 288 of the connector wall 206 decreases and, consequently, the combined capacitive surface 284 decreases in area, which corresponds to a decrease in capacitance. In other words, the capacitance of the tuning capacitor assembly 204 increases as the height 295 of the tuning capacitor assembly 204 increases, and the capacitance of the tuning capacitor assembly 204 decreases as the height 295 of the tuning capacitor assembly 204 decreases. Accordingly, the tuning sheet 210 may be moved relative to the connector wall 206 to change a capacitance of the output resonator 256 (FIG. 9) and thereby fine tune the output resonator 256. The tuning by moving the tuning sheet 210 may be characterized as fine tuning.

For embodiments that include the reference markers 274, the reference markers 274 may be used by the technician to estimate a position of the tuning sheet 210. For instance, the technician may wish to incrementally change the capacitance of the tuning capacitor assembly 204 by moving the tuning sheet 210 such that the bottom edge 290 of the tuning sheet 210 that is aligned with a first reference marker is moved to be aligned with an adjacent second reference marker. The distance between the adjacent first and second reference markers may be, for example, about two (2) mm, about four (4) mm, about six (6) mm, or about eight (8) mm. Accordingly, the reference markers 274 may indicate to the technician an amount of distance that the tuning sheet 210 has been moved. Each reference marker 274 may correspond to a different amount of capacitance.

The distance between adjacent reference markers may be the same throughout or, alternatively, may vary between different reference markers. In particular embodiments, the spacing may have a non-linear distribution in which each subsequent spacing is greater than (or less than) the previous spacing. For example, the reference markers may become closer together as the tuning sheet 210 moves from the top of the output connector 205 to the bottom 296. More specifically, a distance $X_1$ may be defined between a reference marker A, which is located at the bottom 296, and a reference marker B. A distance $X_2$ between the reference marker B and a reference marker C, which is located above the reference marker B, may be 60-95% of $X_1$. A distance $X_3$ between the reference marker C and a reference marker D, which is located above the reference marker C, may be 60-95% of the $X_2$. A total of five to fifteen reference markers may be positioned within this distribution. In some embodiments, the distances between the reference markers are configured to correlate with the same change in resonance frequency. Using the above as an example, the change in resonance frequency from reference marker A to reference marker B may be the same change in resonance frequency from the reference marker C to the reference marker D. Thus, in such embodiments, moving the tuning sheet 210 from any one reference marker to an adjacent reference marker will be the same change in resonance frequency.

Figure 14:
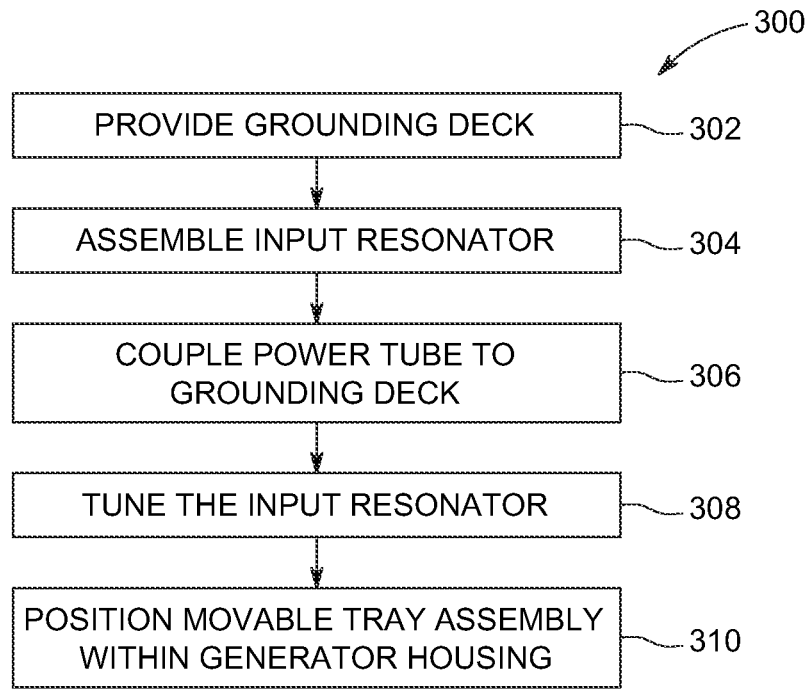
FIG. 14 is a flowchart illustrating a method formed in accordance with an embodiment.

FIG. 14 is a flow chart illustrating a method 300. The method 300, for example, may employ structures or aspects of various embodiments (e.g., systems and/or methods) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In some embodiments, the method 300 may be a method of assembling a movable tray assembly, such as the movable tray assembly 165 (FIG. 3), or a method of assembling a tube amplifier system, such as the tube amplifier system 170 (FIG. 3).

The method 300 includes providing, at 302, a grounding deck. The grounding deck may include a number of interconnected conductive elements, such as a base plate, sidewalls, and conductive elements. The base plate may have a central opening for receiving a power tube. The method may also include assembling, at 304, an input resonator (or a partial input resonator) and operationally coupling the input resonator to the grounding deck to provide a movable tray assembly. The input resonator may include, for example, an inner conductor, one or more capacitors, and an outer conductor. A partial input resonator may include, for example, an inner conductor, one or more capacitors, and one or more ground walls that form part of the outer conductor. Optionally, the input resonator may be assembled, at 304, after or during the assembly of double-disc capacitor, which is described in greater detail in U.S. application Ser. No. 278,346 (553-1927), which is hereby incorporated by reference in its entirety.

In some embodiments, the providing, at 302 and the assembling, at 304, occur when the grounding deck, power tube, and input resonator are located outside of a tube amplifier system and/or a RF power generator. For example, the grounding deck may be mounted to a bench or other structure and the power tube and components of the input resonator may be coupled to the grounding deck and operationally coupled to one another. In some embodiments, the movable tray assembly may be inverted when positioned on the bench. In such embodiments, the technician may have easier access to the components of the input resonator.

The method 300 may also include coupling, at 306, a power tube to the grounding deck. For example, the assembly may be inverted (or flipped over) and the power tube may be coupled to the grounding deck. For example, the power tube may be inserted through an opening of the grounding deck from above the grounding deck such that a portion of the power tube advances into a cavity of the input inner conductor. The power tube may be secured to the base plate of the grounding deck. In this position, a portion of the power tube is located below the grounding deck within the input inner conductor and another portion of the power tube projects above the grounding deck. A tuning capacitor assembly, such as the tuning capacitor assembly 204, may be coupled to the power tube above the grounding deck. The method 300 may also include tuning, at 308, the input resonator so that the input resonator achieves a designated performance.

At 310, the movable tray assembly may be positioned within an interior space of a generator housing. The components of the movable tray assembly (e.g., the power tube, input resonator, one or more capacitors, and the like) may move together as a unit when the movable tray assembly is positioned within the interior space. The positioning, at 310, may include removably mounting the movable tray assembly to a conductor wall of a generator housing. For example, the movable tray assembly may be secured to the conductor wall using tools and/or hardware.

The positioning, at 310, may also include selecting a level of the movable tray assembly from a plurality of possible levels. In some embodiments, the movable tray assembly and the conductor wall are configured relative to each other to provide only a designated number of levels (e.g., two, three, four, or more) for the movable tray assembly. In alternative embodiments, the movable tray assembly has a continuous range of possible levels. The positioning, at 310, may also be characterized as tuning a resonator.

Figure 15:
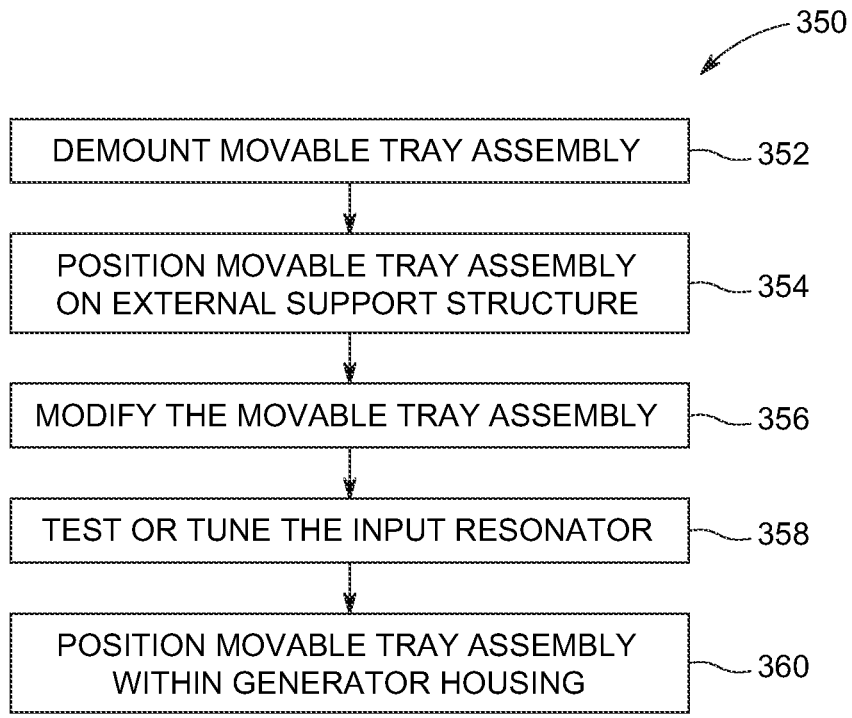
FIG. 15 is a flowchart illustrating a method formed in accordance with an embodiment.

FIG. 15 is a flow chart illustrating a method 350. The method 350, for example, may employ structures or aspects of various embodiments (e.g., systems and/or methods) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In some embodiments, the method 350 may be part of a maintenance procedure, such as replacing a power tube, servicing the input resonator, testing the input resonator, tuning the input resonator, or tuning the output resonator.

The method 350 includes demounting, at 352, a previously-assembled movable tray assembly with respect to a conductor wall of a generator housing. The method 350 also includes positioning, at 354, the movable tray assembly on an external support structure (e.g., bench) that is outside of the RF power generator. The movable tray assembly may include a grounding deck, a power tube, one or more capacitors, and an input resonator. The positioning, at 354, may include inverting the movable tray assembly relative to the orientation of the movable tray assembly within the RF power generator. In the inverted position, the technician may have better access to the components of the input resonator for replacing, repairing, or adjusting one or more of the components.

At 356, the technician may modify the movable tray assembly. For example, the modifying, at 356, may include replacing, repairing, or adjusting one or more of the components. In particular embodiments, the modifying 356 may include replacing the power tube. At 358, the input resonator (or partial input resonator) may be tested and/or tuned so that the input resonator is sufficiently operational for a tube amplifier system. At 360, the movable tray assembly may be positioned within the generator housing. As described herein, the positioning, at 360, may include selecting a level for the movable tray assembly to achieve a desired electrical performance.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, or the like). Similarly, the programs may be stand alone programs, may be incorporated as subroutines in an operating system, may be functions in an installed software package, or the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A tube amplifier system comprising:
    a plurality of conductor walls extending parallel to a longitudinal axis and defining an interior space therebetween;
    a shorting deck extending transverse to the longitudinal axis, the shorting deck being mechanically and electrically coupled to the conductor walls; and
    a movable tray assembly including a grounding deck that extends parallel to the shorting deck, the grounding deck and the shorting deck defining an output cavity therebetween that has a length measured along the longitudinal axis, the movable tray assembly being removably mounted to at least one of the conductor walls such that the grounding deck is capable of being positioned at multiple different levels along the longitudinal axis to change the length of the output cavity.

2. The tube amplifier system of claim 1, wherein the shorting deck is an output shorting deck and the movable tray assembly includes an input shorting deck that extends parallel to the grounding deck and defines an input cavity between the input shorting deck and the grounding deck, the input shorting deck being secured to the grounding deck such that the input shorting deck moves with the grounding deck when the movable tray assembly is moved for positioning within the interior space.

3. The tube amplifier system of claim 2, wherein the movable tray assembly includes a ground wall that extends parallel to the longitudinal axis and mechanically and electrically couples the grounding deck and the input shorting deck, the ground wall and at least one of the conductor walls interfacing with each other to form an outer conductor that surrounds the input cavity.

4. The tube amplifier system of claim 1, wherein the multiple different levels are discrete levels that are spaced apart along the longitudinal axis.

5. The tube amplifier system of claim 1, wherein the movable tray assembly has a perimeter that interfaces with the conductor walls, the movable tray assembly electrically coupling to the conductor walls along the perimeter.

6. The tube amplifier system of claim 1, wherein the movable tray assembly includes flexible conductive elements that are configured to engage the conductor walls.

7. The tube amplifier system of claim 1, wherein the grounding deck includes a securing panel that extends parallel to the longitudinal axis and forms an exterior surface of the movable tray assembly, the securing panel configured to be removably mounted to the at least one conductor wall along the exterior surface.

8. The tube amplifier system of claim 1, further comprising a power tube and an input inner conductor coupled to the movable tray assembly, wherein the power tube, the input inner conductor, and the movable tray assembly are coupled to one another and move as a unit when the movable tray assembly is moved for positioning within the interior space.

9. The tube amplifier system of claim 8, further comprising a tuning capacitor assembly that is operably coupled to the power tube, the tuning capacitor assembly including a connector wall that surrounds and is coupled to the power tube, the tuning capacitor assembly also including a tuning sheet that surrounds the power tube and interfaces with the connector wall, wherein the connector wall and the tuning sheet include outer sides that form a combined capacitive surface, the tuning sheet being movable along the central axis to change a size of the combined capacitive surface and adjust an amount of capacitance provided by the tuning capacitor assembly.

10. A movable tray assembly configured to form part of a tube amplifier system, the movable tray assembly comprising:
    a grounding deck having an input side and an output side that face in opposite directions;
    a ground wall extending away from the input side of the grounding deck; and
    a shorting deck extending parallel to the grounding deck, the ground wall extending between and mechanically and electrically coupling the grounding deck and the shorting deck, wherein the grounding deck, the ground wall, and the shorting deck define an input cavity, wherein the grounding deck, the ground wall, and the shorting deck are configured to have fixed positions with respect to one another and move as a unit when the movable tray assembly is moved for positioning with respect to the tube amplifier system.

11. The tube amplifier system of claim 1, wherein the movable tray assembly is capable of being removably mounted to the at least one conductor wall such that the movable tray assembly may be readily mounted to or demounted from the at least one conductor wall without destroying the movable tray assembly or the at least one conductor wall.

12. The movable tray assembly of claim 10, wherein the grounding deck and the shorting deck include exterior surfaces that are configured to interface with conductor walls of the tube amplifier system, the exterior surfaces including flexible conductive elements that are configured to removably engage the conductor walls.

13. The movable tray assembly of claim 10, further comprising a power tube that extends away from the output side of the grounding deck and an input inner conductor that is positioned within the input cavity, wherein the grounding deck, the shorting deck, the power tube, and the input inner conductor are configured to have fixed positions with respect to one another and move as a unit when the movable tray assembly is moved for positioning with respect to the tube amplifier system.

14. The movable tray assembly of claim 13, further comprising a tuning capacitor assembly that is coupled to the power tube, the tuning capacitor assembly including a connector wall that surrounds and is coupled to the power tube, the tuning capacitor assembly also including a tuning sheet that surrounds the power tube and interfaces with the connector wall, wherein the connector wall and the tuning sheet include outer sides that form a combined capacitive surface, the tuning sheet being movable along the central axis to change a size of the combined capacitive surface and adjust an amount of capacitance provided by the tuning capacitor assembly.

15. The movable tray assembly of claim 10, wherein the grounding deck includes a securing panel that extends parallel to the longitudinal axis and forms an exterior surface of the movable tray assembly, the securing panel configured to be removably mounted to at least one of the conductor walls along the exterior surface.

16. A tuning capacitor assembly comprising:
a connector wall surrounding a central axis and defining a thru-hole that is configured to receive a power tube, the connector wall having an inner side that faces inward toward the central axis and an outer side that faces outward away from the central axis; and
a tuning sheet surrounding the central axis and interfacing with the connector wall, the tuning sheet having an inner side that faces inward toward the central axis and an outer side that faces outward away from the central axis, wherein the outer sides of the connector wall and the tuning sheet form a combined capacitive surface, the tuning sheet being movable along the central axis to change a size of the combined capacitive surface and adjust an amount of capacitance provided by the tuning capacitor assembly.

17. The tuning capacitor assembly of claim 16, wherein the connector wall includes reference markers that each correspond to a different size of the combined capacitive surface when the tuning sheet is aligned with the reference marker.

18. The tuning capacitor assembly of claim 16, wherein the connector wall and the tuning sheet are annular.

19. The tuning capacitor assembly of claim 16, wherein the inner side of the tuning sheet interfaces with the outer side of the connector wall.

20. The tuning capacitor assembly of claim 16, further comprising a radial wall that extends from the connector wall toward the central axis, the radial wall defining the thru-hole.

* * * * *